(12) United States Patent
Harada et al.

(10) Patent No.: US 11,084,837 B2
(45) Date of Patent: Aug. 10, 2021

(54) CHEMICAL DEPOSITION RAW MATERIAL INCLUDING IRIDIUM COMPLEX AND CHEMICAL DEPOSITION METHOD USING THE CHEMICAL DEPOSITION RAW MATERIAL

(71) Applicant: TANAKA KIKINZOKU KOGYO K.K., Tokyo (JP)

(72) Inventors: Ryosuke Harada, Tsukuba (JP); Toshiyuki Shigetomi, Tsukuba (JP); Kazuharu Suzuki, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 16/478,417

(22) PCT Filed: Mar. 5, 2018

(86) PCT No.: PCT/JP2018/008395
§ 371 (c)(1),
(2) Date: Jul. 16, 2019

(87) PCT Pub. No.: WO2018/173724
PCT Pub. Date: Sep. 27, 2018

(65) Prior Publication Data
US 2019/0367545 A1    Dec. 5, 2019

(30) Foreign Application Priority Data
Mar. 24, 2017    (JP) .............................. JP2017-059958

(51) Int. Cl.
*C07F 15/00* (2006.01)
*C23C 16/16* (2006.01)

(52) U.S. Cl.
CPC .......... *C07F 15/0033* (2013.01); *C23C 16/16* (2013.01)

(58) Field of Classification Search
None
See application file for complete search history.

(56) References Cited

U.S. PATENT DOCUMENTS 6,143,191 A * 11/2000 Baum ....................... C23F 1/12
216/63
2004/0215029 A1   10/2004 Takamori et al.
(Continued)

FOREIGN PATENT DOCUMENTS

JP    2001-181841 A    7/2001
JP    2005-225855 A    8/2005
(Continued)

OTHER PUBLICATIONS

Hughes et al, Organometallics 1993, 12, 2025-2031.*
(Continued)

*Primary Examiner* — Clinton A Brooks
(74) *Attorney, Agent, or Firm* — Foley & Lardner LLP

(57) ABSTRACT

The present invention relates to a chemical deposition raw material for manufacturing an iridium thin film or an iridium compound thin film by a chemical deposition method, including an iridium complex in which cyclopropenyl or a derivative thereof and a carbonyl ligand are coordinated to iridium. The iridium complex that is applied in the present invention enables an iridium thin film to be manufactured even when a reducing gas such as hydrogen is applied.

(Continued)

[Chemical Formula 1]

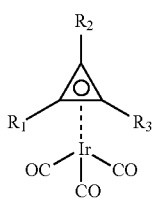

in which $R_1$ to $R_3$, which are substituents of the cyclopropenyl ligand, are each independently hydrogen, or a linear or branched alkyl group with a carbon number of 1 or more and 4 or less.

7 Claims, 2 Drawing Sheets

(56) References Cited

U.S. PATENT DOCUMENTS

| | | |
|---|---|---|
| 2006/0204660 A1 | 9/2006 | Kawano et al. |
| 2010/0221577 A1 | 9/2010 | Dussarrat |
| 2011/0287175 A1 | 11/2011 | Suzuki et al. |
| 2013/0252438 A1 | 9/2013 | Dussarrat et al. |
| 2015/0225437 A1 | 8/2015 | Harada et al. |
| 2018/0119274 A1 | 5/2018 | Harada et al. |

FOREIGN PATENT DOCUMENTS

| | | |
|---|---|---|
| JP | 2005-232142 A | 9/2005 |
| JP | 2010-504424 A | 2/2010 |
| JP | 2010-173979 A | 8/2010 |
| JP | 2014-037390 A | 2/2014 |
| JP | 2016-211049 A | 12/2016 |
| JP | 2017-008351 A | 1/2017 |

OTHER PUBLICATIONS

International Searching Authority, "International Search Report," issued in connection with International Patent Application No. PCT/JP2018/008395, dated Apr. 3, 2018.

International Searching Authority, "Written Opinion," issued in connection with International Patent Application No. PCT/JP2018/008395, dated Apr. 3, 2018.

Lichtenberger et al., "Electron Distribution and Bonding in $\eta^3$-Cyclopropenyl-Metal Complexes," Organometallics, vol. 12, No. 6, 1993, pp. 2025-2031.

Hughes et al., Preparation and Dynamic Behavior of $\eta^3$-Cyclopropenyl Complexes of Cobalt, Rhodium, and Iridium. Crystal and Molecular Structure of $[Ir(\eta^3-C_3{}^tBu_3)(CO)_3]$, Organometallics, vol. 12, No. 8, 1993, pp. 3069-3074.

Shen et al., "Kinetics of CO substitution in reactions of $\eta^3$-cyclopropenyl complexes of iron, cobalt, rhodium, and iridium with phosphorus ligands. First examples of a dissociative mechanism for CO substitution in the cobalt triad carbonyl complexes," J. Am. Chem. Soc., vol. 115, No. 24, 1993, pp. 11312-11318.

Hughes et al., "Reversible Insertion of Iridium into a Cyclopropenyl Carbon-Carbon Bond," Organometallics, vol. 13, No. 12, 1994, pp. 4664-4666.

Hughes et al., "$\eta^3$-cyclopropenyl is isolobal with NO, but not with $\eta^3$-propenyl(Allyl): Evidence from conformational preferences and rotational barriers in alkene and alkyne complexes of iridium," Organometallics, vol. 12, No. 12, 1993, pp. 4736-4738.

* cited by examiner

TEST No. 1

TEST No. 2

TEST No. 3

TEST No. 4

CHEMICAL DEPOSITION RAW MATERIAL INCLUDING IRIDIUM COMPLEX AND CHEMICAL DEPOSITION METHOD USING THE CHEMICAL DEPOSITION RAW MATERIAL

RELATED APPLICATIONS

The present application claims priority under 37 U.S.C. § 371 to International Patent Application No. PCT/JP2018/008395, filed Mar. 5, 2018, which claims priority to and the benefit of Japanese Patent Application No. 2017-059958, filed on Mar. 24, 2017. The contents of these applications are hereby incorporated by reference in their entireties.

TECHNICAL FIELD

The present invention relates to a chemical deposition raw material for manufacturing an iridium thin film or an iridium compound thin film by a chemical deposition method, the chemical deposition raw material including an iridium complex. Specifically, the present invention relates to a chemical deposition raw material which has moderate thermal stability and to which a reducing gas is applicable as a reaction gas.

BACKGROUND ART

As thin film electrode materials of various semiconductor devices such as DRAM and FERAM, thin films including iridium or an iridium compound (hereinafter, referred to as iridium-containing thin films) are used. As methods for producing these thin films, chemical deposition methods such as a CVD method (chemical vapor deposition method) and an ALD method (atomic layer deposition method) are applied. As raw material compounds that are used in a chemical deposition method, many compounds including an iridium complex have been heretofore known.

As an iridium complex that forms a chemical deposition raw material, an iridium complex is well known which includes cyclopentadiene or a cyclopentadienyl ligand being a derivative of the cyclopentadiene as a ligand. For example, Patent Document 1 discloses a method for manufacturing an iridium-containing thin film using, as a chemical deposition raw material, (1-methylcyclopentadienyl)(1,5-cyclooctadiene)iridium of Chemical Formula 1 in which 1-methylcyclopentadienyl and 1,5-cyclooctadiene are coordinated. Further, Patent Document 2 discloses a method for manufacturing an iridium-containing thin film using, for example, (1-ethylcyclopentadienyl)(1,3-cyclohexadiene)iridium of Chemical Formula 2 in which 1-ethylcyclopentadienyl and 1,3-cyclohexadiene are coordinated.

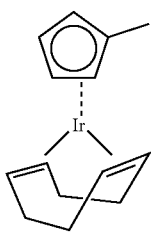

[Chemical Formula 1]

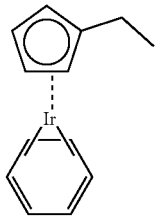

[Chemical Formula 2]

RELATED ART DOCUMENT

Patent Documents

Patent Document 1: JP 2001-181841 A
Patent Document 2: JP 2005-232142 A

SUMMARY OF THE INVENTION

Problems to be Solved by the Invention

In a chemical deposition method, a raw material including an iridium complex is vaporized, the resulting raw material gas is transported to a surface of a substrate, and the iridium complex is decomposed to manufacture an iridium-containing thin film. Heating is generally performed for decomposition of the iridium complex on the surface of the substrate. Further, a reaction gas such as oxygen may be mixed with the raw material gas to decompose the complex by action of the reaction gas together with heating. Further, excitation energy of plasma or the like may be used.

Now, the above-described iridium complex that forms a chemical deposition raw material has high thermal stability, and thus can be transported onto a substrate in a stable state even after being vaporized. However, the conventional iridium complex has some problems which are caused by the high stability thereof.

Specifically, when deposition is performed only by heating with the conventional iridium complex as a raw material, carbon and the like that form a ligand of the complex tend to an iridium-containing thin film as impurities, leading to deterioration of film properties such as an increase in specific resistance. Thus, in manufacturing of an iridium-containing thin film with the conventional iridium complex, oxygen or ozone is often used as a reaction gas to improve film quality. However, use of oxygen and ozone may cause oxidation of a base (substrate) for the thin film. Further, in the thin film which is manufactured, iridium oxide is easily generated, so that it is difficult to manufacture pure iridium thin films and other constituent iridium thin films.

Such a problem can be solved if a reducing gas such as hydrogen can be used as a reaction gas. However, the conventional iridium complex has poor reactivity with hydrogen or the like, so that there is a problem in film quality as in deposition performed only by heat.

Further, the complex can be decomposed by use of plasma instead of heating and use of a reaction gas, but use of plasma may damage the base. From the viewpoint of handiness of a device or the like and process control, it is preferable to mainly use heat as decomposition energy in a chemical deposition method.

Thus, the present invention provides a chemical deposition raw material for manufacturing an iridium-containing thin film, the chemical deposition raw material including an iridium complex, and enabling a high-quality iridium-containing thin film to be manufactured more easily as compared to conventional chemical deposition raw materials. Specifically, the present invention reveals a chemical deposition raw material including an iridium complex which can be decomposed without use of oxygen, and has moderate thermal stability.

Means for Solving the Problems

The present invention for solving the above-described problems provides a chemical deposition raw material for manufacturing an iridium thin film or an iridium compound thin film by a chemical deposition method, including an iridium complex in which cyclopropenyl or a derivative thereof and a carbonyl ligand are coordinated to iridium, the iridium complex being represented by the following formula:

[Chemical Formula 3]

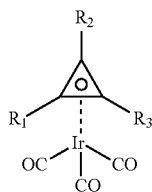

in the formula, $R_1$ to $R_3$, which are substituents of the cyclopropenyl ligand, are each independently hydrogen, or a linear or branched alkyl group with a carbon number of 1 or more and 4 or less.

The above-described iridium complexes that form conventional chemical deposition raw materials include a cyclopentadienyl ligand. According to the present inventors, the high thermal stability of the conventional iridium complexes is caused by the cyclopentadienyl ligand. The chemical deposition raw material according to the present invention includes an iridium complex having both of cyclopropenyl or a derivative thereof (sometimes referred to as a cyclopropenyl ligand) and a carbonyl ligand as ligands. Application of these ligands is intended for ensuring that the iridium complex has thermal stability in a moderate range. The iridium complex has thermal stability lower than that of an iridium complex including a cyclopentadienyl ligand.

Thus, by applying a reducing gas such as hydrogen together with heating, the iridium complex of the present invention can be decomposed to produce iridium. The iridium complex of the present invention contains carbon in the ligand, however, since the iridium complex has appropriate thermal stability, impurities such as carbon do not remain in decomposition. Therefore, the present invention enables a high-quality iridium-containing thin film to be manufactured.

Further, the iridium complex which is applied in the present invention has an appropriately high vapor pressure that is required as a basic property of a chemical deposition raw material. This is ascribable to limitation of substituents $R_1$ to $R_3$ of the cyclopropenyl ligand to hydrogen or an alkyl group with a carbon number of 1 or more and 4 or less.

The configurations of the iridium complexes of the chemical deposition raw materials of the present invention, which have the above-mentioned advantages, will be described in detail below.

In the iridium complex that is applied in the present invention, a cyclopropenyl ligand is coordinated. This is intended for ensuring that the iridium complex has appropriate thermal stability. Substituents $R_1$ to $R_3$ in the cyclopropenyl ligand are each independently hydrogen, or a linear or branched alkyl group with a carbon number of 1 or more and 4 or less. The carbon number of each of substituents $R_1$ to $R_3$ is limited to 1 or more and 4 or less in consideration of the vapor pressure as described above. When the carbon number is excessively large, the vapor pressure may decrease.

For substituents $R_1$ to $R_3$ of the cyclopropenyl ligand, it is preferable that each of $R_1$ and $R_2$ is a t-butyl group, and $R_3$ is one of a methyl group, an ethyl group, an isopropyl group and a t-butyl group. This is intended for stabilizing the complex structure to attain preferred thermal stability.

In the iridium complex that is applied in the present invention, three carbonyl ligands are coordinated together with a cyclopropenyl ligand. The carbonyl ligands are selected as a result of considering the binding strength of the cyclopropenyl ligand to metal iridium. As a result of coordinating the cyclopropenyl ligand and the carbonyl ligand, the iridium complex has appropriate thermal property.

With regard to the above-described iridium complex of the present invention, specific examples of preferred complexes are shown below.

TABLE 1

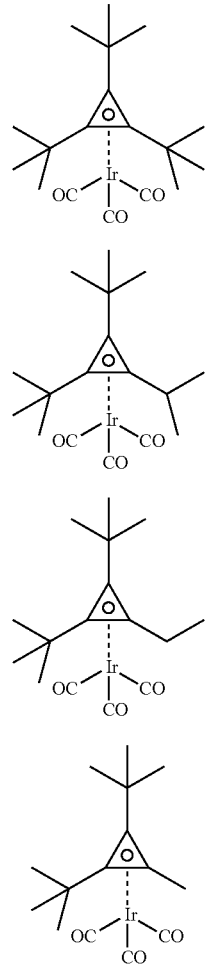

TABLE 1-continued
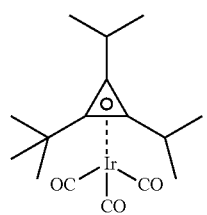
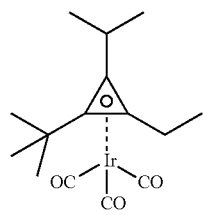
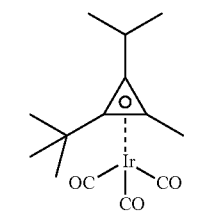
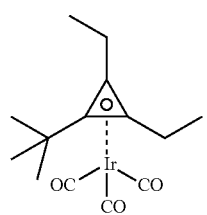
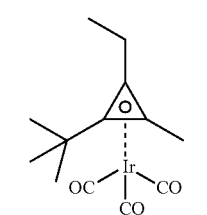
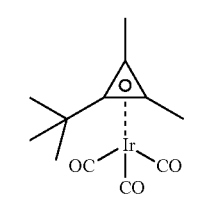
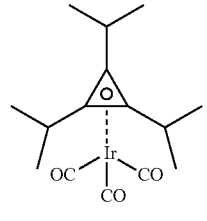
TABLE 1-continued
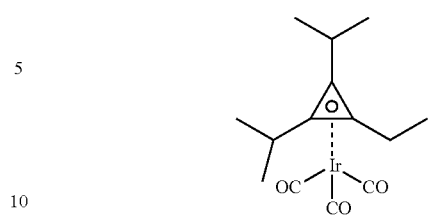
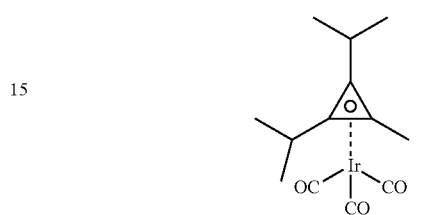
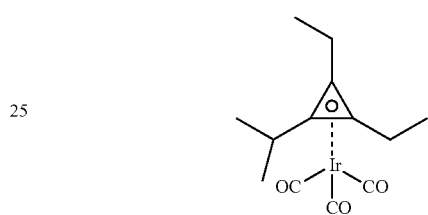
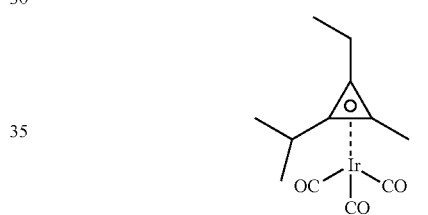
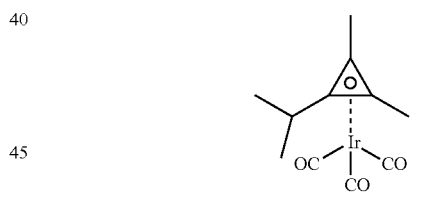
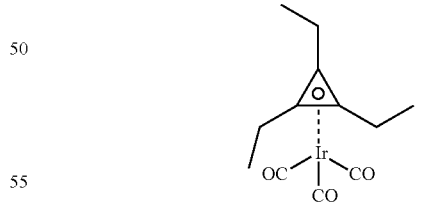
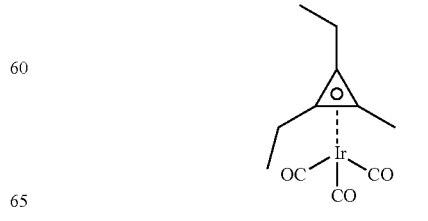

TABLE 1-continued

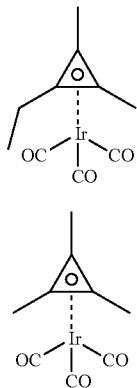

A chemical deposition method of an iridium-containing thin film in which the chemical deposition raw material of the present invention is applied will now be described. In the chemical deposition method of the present invention, a raw material including an iridium complex as described above is vaporized by heating to produce a raw material gas, and the iridium complex in the raw material gas is heated and decomposed on a surface of a substrate to form an iridium thin film.

With regard to the form of the raw material in the chemical deposition method, the iridium complex that is applied in the present invention is liquid or solid at normal temperature. However, even when the iridium complex is solid, the iridium complex has a high vapor pressure, and thus can be easily vaporized by a sublimation method. Therefore, in the chemical deposition method of the present invention, a raw material can be vaporized by heating the raw material as it is. Further, a raw material gas can also be obtained by solving the raw material in an appropriate solvent to obtain a solution, and heating the solution. The raw material heating temperature is preferably 40° C. or higher and 120° C. or lower.

Normally, the vaporized raw material is transported as a raw material gas onto the substrate together with a carrier gas. The carrier gas for the iridium complex of the present invention is preferably an inert gas (argon, nitrogen or the like).

Further, the chemical deposition raw material of the present invention enables an iridium-containing thin film to be deposited without use of a reaction gas. The iridium complex of the present invention has lower thermal stability as compared to conventional techniques, and enables deposition to be performed only by heating. However, it is preferable to use a reaction gas for performing deposition while reducing the possibility that impurities remain. A reducing gas species such as hydrogen, ammonia, hydrazine, formic acid or carbon monoxide can be applied as the reaction gas. Applicability of the reducing gas as a reaction gas is a characteristic of the present invention which applies an iridium complex having appropriate thermal stability. In the present invention, an iridium-containing thin film can be deposited without use of an oxygen atom-containing gas species such as oxygen or ozone.

It should be noted that the present invention does not exclude application of oxygen as a reaction gas. In deposition of an iridium compound thin film of iridium oxide or the like, an oxygen gas can be applied as a reaction gas. The reaction gas can also serve as a carrier gas. The reaction gas is mixed with the vaporized iridium complex, and a carrier gas if necessary, and supplied onto the substrate.

The deposition temperature during deposition is preferably 200° C. or higher and 400° C. or lower. When the temperature is lower than 200° C., a deposition reaction hardly proceeds, and thereby efficient deposition cannot be performed. Further, when the deposition temperature is excessively high, the purity of the film may be reduced due to ingress of impurities. Normally, the deposition temperature is adjusted by the substrate heating temperature.

Advantageous Effects of the Invention

As described above, the iridium complex that forms the chemical deposition raw material of the present invention has preferred thermal stability within a range required for the chemical deposition raw material because a ligand to be coordinated to iridium is properly selected. For the thermal stability, the iridium complex of the present invention has moderate stability for handling the iridium complex as a chemical deposition raw material. Further, the iridium complex has a suitable vapor pressure as a result that ligands and substituents thereof have been adjusted.

Since the chemical deposition raw material of the present invention has appropriate thermal stability, an iridium-containing thin film can be manufactured even when a reducing gas such as hydrogen is used as a reaction gas. Here, ingress of impurities such as carbon into the produced iridium-containing thin film is suppressed. Further, since use of oxygen, ozone or the like as a reaction gas is no longer essential, it is not necessary to worry about oxidation damage to the substrate.

Thus, the chemical deposition raw material of the present invention is useful for formation of highly miniaturized semiconductor devices of recent years.

DESCRIPTION OF EMBODIMENTS

Hereinafter, the best embodiments in the present invention will be described.

First Embodiment

In this embodiment, tricarbonyl[$\eta^3$-1,2,3-tri-t-butylcyclopropenyl]iridium of the following formula was synthesized as an iridium complex having a cyclopropenyl ligand and a carbonyl ligand as ligands, and physical property measurement and deposition tests of the resultant were conducted.

[Chemical Formula 4]

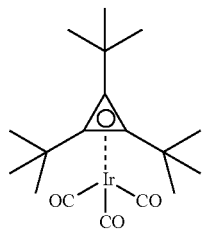

[Synthesis of Complex]

5 ml of a solution of 1.00 g (1.19 mmol) of bis(triphenylphosphoranylidene)ammonium tetracarbonyliridate in dichloromethane was prepared. To this solution was added dropwise 10 ml of a solution of 0.35 g (1.19 mmol) of 1,2,3-tri-t-butylcyclopropenyl tetrafluoroborate in dichloromethane. The mixed solution was stirred for 2 hours, the solvent was then distilled off under a reduced pressure, hexane was added to the residues thus obtained, and the mixture was extracted.

From the extract, hexane was distilled off under a reduced pressure, and the crude product thus obtained was subjected to sublimation purification. Through the above operation, 0.34 g (0.70 mmol) of tricarbonyl($\eta^3$-1,2,3-tri-t-butylcyclopropenyl)iridium as a specified substance was obtained (yield: 59%). The reaction formula in the above synthesis operation is shown below.

[Chemical Formula 5]

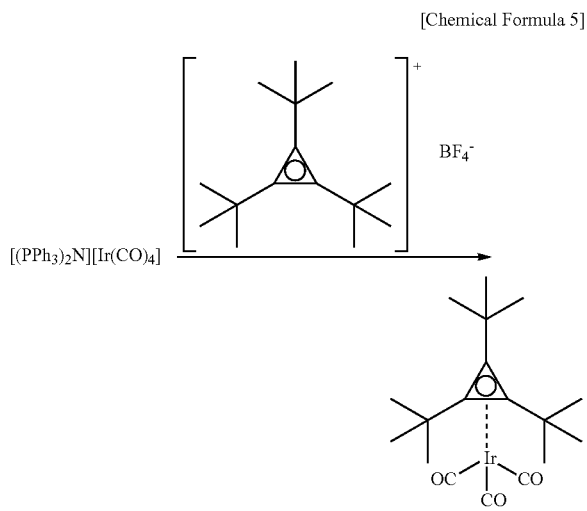

[Differential Thermal Analysis-Thermogravimetry]

The physical properties of the iridium complex manufactured in this embodiment were evaluated. In an evaluation test thereof, differential thermal analysis-thermogravimetry (TG-DTA) was performed in each of a nitrogen atmosphere and a hydrogen atmosphere to examine the decomposition property of the complex. In this evaluation test, TG-DTA2000SA manufactured by BRUKER Corporation was used as an analyzer. An iridium complex sample (sample weight: 5 mg) was packed in an aluminum cell, and a change in weight was observed over a measurement temperature range, i.e. of room temperature to 400° C., at a temperature elevation rate of 5° C./min.

Further, in this physical property evaluation test, TG-DTA was also performed for (1-methylcyclopentadienyl)(1,5-cyclooctadiene)iridium (Comparative Example 1) and (1-ethylcyclopentadienyl)(1,3-cyclohexadiene)iridium (Comparative Example 2) as conventional arts, and a difference in decomposition property between these complexes and the complex of this embodiment was examined. These iridium complexes of Comparative Examples were synthesized in accordance with the methods in the patent documents, and used as samples.

Figure 1:
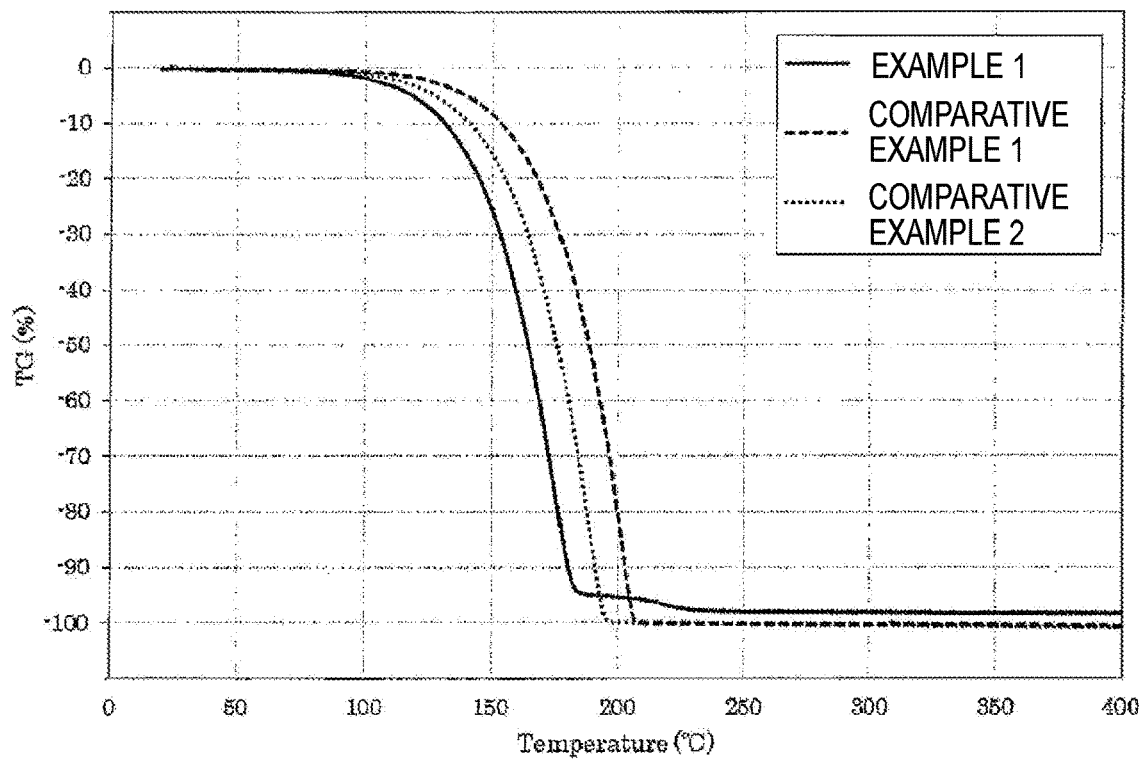
FIG. 1 illustrates a result of TG-DTA measurement (in a nitrogen atmosphere) of an iridium complex of a first embodiment.

FIG. 1 illustrates a result of TG-DTA measured in a nitrogen atmosphere. From FIG. 1, it is revealed that as compared to the conventional iridium complexes of Comparative Examples 1 and 2, the iridium complex of this embodiment has a more favorable vaporization property because a weight loss occurs at a lower temperature. Further, it can be confirmed that the iridium complex of this embodiment has a lower decomposition temperature as compared to Comparative Examples 1 and 2, and thus can be deposited at a lower temperature.

Figure 2:
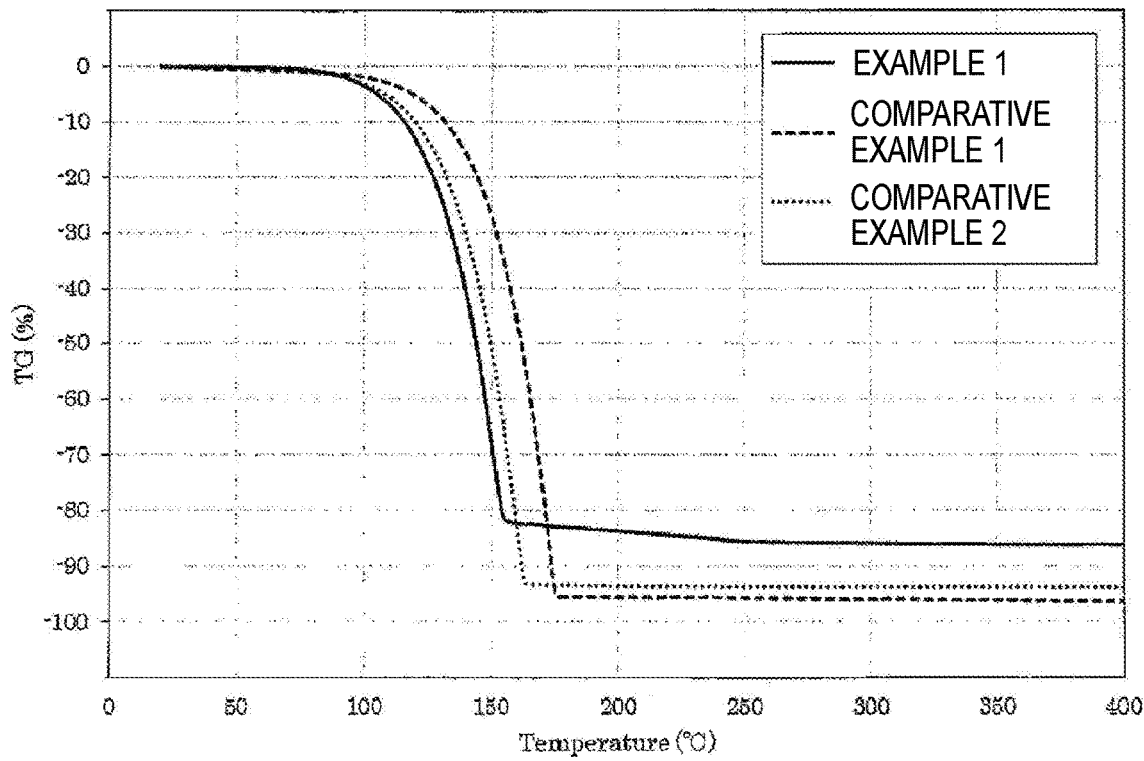
FIG. 2 illustrates a result of TG-DTA measurement (in a hydrogen atmosphere) of the iridium complex of the first embodiment.

Next, FIG. 2 illustrates a result of TG-DTA measured in a hydrogen atmosphere. In the hydrogen atmosphere, the iridium complex of this embodiment underwent a mass loss and decomposition at a lower temperature as compared to the conventional iridium complexes of Comparative Examples, and thus showed the same tendency as in the nitrogen atmosphere. Further, the mass loss ended at a low temperature. From the above result, the iridium complex of this embodiment was confirmed to be effectively decomposed in a hydrogen atmosphere.

[Deposition test]

An iridium thin film was deposited by a CVD apparatus (hot wall-type CVD deposition apparatus) by use of the iridium complex according to this embodiment as a raw material. The deposition conditions are as described below. An iridium thin film was deposited while the deposition temperature and the deposition pressure were changed, and the thickness and the specific resistance of the thin film were measured. The results of the deposition test are shown in Table 2, and SEM images of the manufactured iridium thin films are shown in Table 3.

Substrate: Si
Deposition temperature: 250° C., 300° C. and 350° C.
Sample temperature (vaporization temperature): 45° C.
Pressure: 3 torr, 15 torr
Reaction gas (carrier gas): hydrogen gas
Gas flow rate: 50 sccm
Deposition time: 30 min

TABLE 2

| Test No. | Deposition temperature | Deposition pressure | Ir thickness/nm | Specific resistance/$\mu\Omega \cdot$ cm |
|---|---|---|---|---|
| 1 | 350° C. | 3 torr | 26 | 300 |
| 2 | 300° C. | | 18 | 270 |
| 3 | 250° C. | | 13 | 130 |
| 4 | 300° C. | 15 torr | 20 | 99 |

Figure 3:
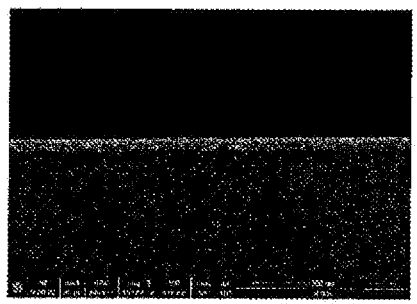
FIG. 3 shows a SEM image of an iridium thin film manufactured using the iridium complex of the first embodiment as a raw material.
Figure 3:
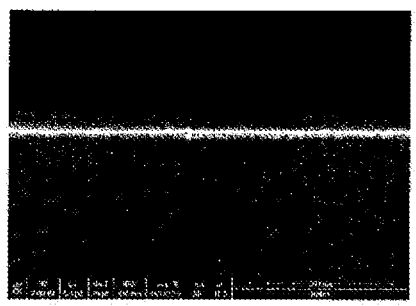
Figure 3:
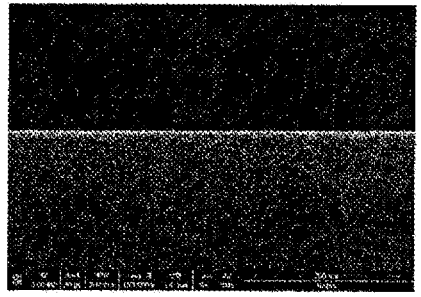
Figure 3:
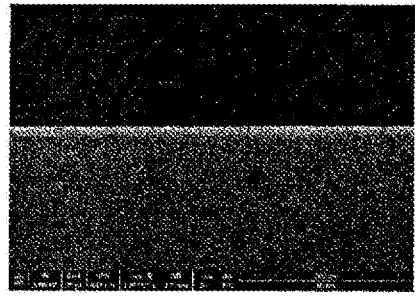

From FIG. 3, it is appreciated that when the iridium complex according to this embodiment is used as a raw material, an iridium thin film can be manufactured with a hydrogen gas as a reaction gas under any deposition conditions. Comparison of the results under the deposition conditions of tests Nos. 1 to 4 revealed that the specific resistance of a thin film manufactured became lower as the deposition temperature decreased and the pressure during deposition increased. The results of the deposition tests showed that application of the iridium complex according to this embodiment enabled a more favorable iridium film to be manufactured through reaction with hydrogen at a low temperature.

Second Embodiment

In this embodiment, tricarbonyl[$\eta^3$-1,2-di-t-butyl-3-ethylcyclopropenyl)iridium of the following formula was synthesized as an iridium complex having a cyclopropenyl ligand and a carbonyl ligand as ligands.

[Chemical Formula 6]

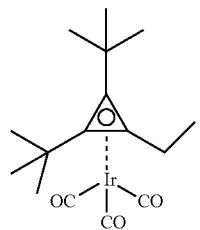

1 ml of a solution of 0.084 g (0.10 mmol) of bis(triphenylphosphoranylidene)ammonium tetracarbonyliridate in acetone was prepared. To this solution was added dropwise 2 ml of a solution of 0.028 g (0.10 mmol) of 1,2-di-t-butyl-3-ethylcyclopropenyl tetrafluoroborate in acetone. The mixed solution was stirred for 1 hour, the solvent was then distilled off under a reduced pressure, hexane was added to the residues thus obtained, and the mixture was extracted.

From the extract, hexane was distilled off under a reduced pressure to obtain 0.015 g (0.033 mmol) of tricarbonyl ($\eta^3$-1,2-di-t-butyl-3-ethylcyclopropenyl)iridium as a specified substance (yield: 33%). The reaction formula in the above synthesis operation is shown below.

[Chemical Formula 7]

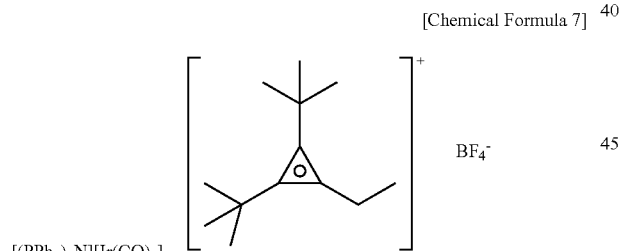

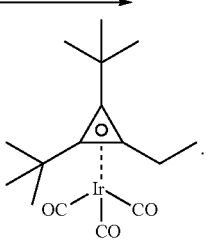

Third Embodiment

In this embodiment, tricarbonyl[$\eta^3$-1,2-di-t-butyl-3-methylcyclopropenyl)iridium of the following formula was synthesized as an iridium complex having a cyclopropenyl ligand and a carbonyl ligand as ligands.

[Chemical Formula 8]

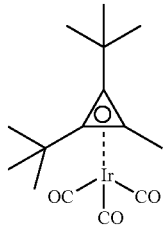

1 ml of a solution of 0.084 g (0.10 mmol) of bis(triphenylphosphoranylidene)ammonium tetracarbonyliridate in acetone was prepared. To this solution was added dropwise 2 ml of a solution of 0.027 g (0.10 mmol) of 1,2-di-t-butyl-3-methylcyclopropenyl tetrafluoroborate in acetone. The mixed solution was stirred for 1 hour, the solvent was then distilled off under a reduced pressure, hexane was added to the residues thus obtained, and the mixture was extracted.

From the extract, hexane was distilled off under a reduced pressure to obtain 0.015 g (0.036 mmol) of tricarbonyl ($\eta^3$-1,2-di-t-butyl-3-methylcyclopropenyl)iridium as a specified substance (yield: 36%). The reaction formula in the above synthesis operation is shown below.

[Chemical Formula 9]

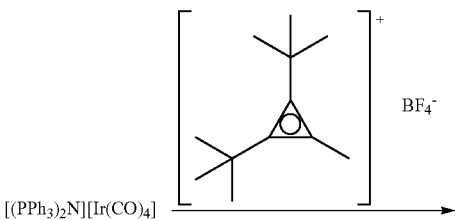

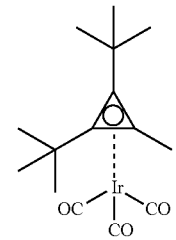

For the iridium complexes manufactured in the second and third embodiments, TG-DTA was performed in the same manner as in the first embodiment, and the results showed that both the iridium complexes had a lower decomposition temperature as compared to conventional arts, and were easily decomposed even in a hydrogen atmosphere. Further, for the iridium complexes manufactured in the second and third embodiments, a deposition test was conducted under the same conditions as in the first embodiment (250° C., 3 torr) with a hydrogen gas used as a reaction gas, and the results showed that a favorable iridium thin film comparable to that of the first embodiment was manufactured.

INDUSTRIAL APPLICABILITY

A chemical deposition raw material according to the present invention includes an iridium complex having thermal stability in an appropriate range, and enables an iridium-containing thin film with favorable quality to be manufactured even when a hydrogen gas is used as a reaction gas. The chemical vapor deposition raw material of the present invention is suitably used as a thin film electrode material of a semiconductor device such as DRAM or FERAM.

The invention claimed is:

1. A chemical deposition method of an iridium thin film or an iridium compound thin film, comprising: preparing a raw material gas by vaporizing a raw material including an iridium complex; introducing the raw material gas to a surface of a substrate; and simultaneously heating the raw material gas to decompose the iridium complex, wherein the raw material used is an iridium complex in which a cyclopropenyl ligand and a carbonyl ligand are coordinated to iridium, the iridium complex being represented by a following formula:

[Chemical Formula 1]

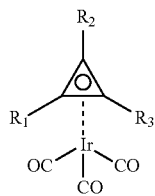

and, wherein $R_1$ to $R_3$, which are substituents of the cyclopropenyl ligand, are each independently hydrogen, or a linear or branched alkyl group with a carbon number of 1 or more and 4 or less.

2. The chemical deposition method according to claim 1, wherein a reducing gas is used as a reaction gas.

3. A chemical deposition method of an iridium thin film or an iridium compound thin film, comprising: preparing a raw material gas by vaporizing a raw material including an iridium complex; introducing the raw material gas to a surface of a substrate; and simultaneously heating the raw material gas to decompose the iridium complex, wherein the chemical deposition raw material defined in claim 1 in the raw material.

4. The chemical deposition method according to claim 1, wherein the raw material is heated at 40° C. or higher and 120° C. or lower to be vaporized to obtain a raw material gas.

5. The chemical deposition method according to claim 4, wherein the iridium complex is heated at a deposition temperature of 160° C. or higher and 400° C. or lower to be decomposed to obtain a raw material gas.

6. The chemical deposition method according to claim 1, wherein the iridium complex is heated at a deposition temperature of 160° C. or higher and 400° C. or lower to be decomposed to obtain a raw material gas.

7. The chemical deposition raw material according to claim 1, wherein each of $R_1$ and $R_2$ is a t-butyl group, and $R_3$ is one of a methyl group, an ethyl group, an isopropyl group and a t-butyl group.

* * * * *